US009036444B1

(12) United States Patent
Silberman et al.

(10) Patent No.: US 9,036,444 B1
(45) Date of Patent: May 19, 2015

(54) REDUNDANT MEMORY SYSTEM AND ASSOCIATED METHOD THEREOF (75) Inventors: Joshua Silberman, San Francisco, CA (US); Wayne Ando, San Jose, CA (US); David Robles, Granite Bay, CA (US); William McGovern, San Jose, CA (US)

(73) Assignee: NETAPP, INC., Sunnyvale, CA (US)

( * ) Notice: Subject to any disclaimer, the term of this patent is extended or adjusted under 35 U.S.C. 154(b) by 1023 days.

(21) Appl. No.: 13/045,287

(22) Filed: Mar. 10, 2011

(51) Int. Cl.
*G11C 5/14* (2006.01)

(52) U.S. Cl.
CPC .................................. *G11C 5/14* (2013.01)

(58) Field of Classification Search
CPC ...... G11C 29/808; G11C 29/785; G11C 5/14; G11C 5/147; G11C 5/141; G11C 7/12
USPC ........................ 365/200, 229, 228, 189.1, 226
See application file for complete search history.

(56) References Cited

U.S. PATENT DOCUMENTS

| 2004/0193955 A1* | 9/2004 | Leete et al. ..................... 714/22 |
| 2006/0095662 A1* | 5/2006 | Arnott ........................... 711/114 |
| 2009/0100217 A1* | 4/2009 | Battaglia et al. ............... 711/103 |
| 2010/0008175 A1* | 1/2010 | Sweere et al. ................. 365/229 |

* cited by examiner

*Primary Examiner* — Son Dinh
*Assistant Examiner* — Uyen B Tran
(74) *Attorney, Agent, or Firm* — Klein, O'Neill & Singh, LLP (57) ABSTRACT Method and system are provided for handling data when power failure from a primary power source of a storage system is detected. The system provides a first memory and a second memory. The first memory is primarily used to store data when the primary power source is operating. If a power failure is detected, a first indicator is set to indicate that data is stored or being transferred to the second memory. Thereafter, data is transferred from the first memory to the second memory. Any errors during the transfer are logged. Once power is restored, data is transferred back to the first memory. A second indicator is set to indicate that there is no data at the second memory.

24 Claims, 6 Drawing Sheets

| Block Id 202 | LBA 204 | Physical Address 206 |
|---|---|---|
| B₀ | 0 | 0 |
| ⋮ | ⋮ | ⋮ |
| Bₙ | XXX | XXX |

FIG. 2B

| BLOCK ID 302 | LBA 304 | DEFECTIVE BLOCK 306 |
|---|---|---|
|  |  |  |

REDUNDANT MEMORY SYSTEM AND ASSOCIATED METHOD THEREOF

TECHNICAL FIELD

The present disclosure relates to computing systems.

BACKGROUND

A storage system typically comprises one or more storage devices where data may be entered, and from which data may be obtained, as desired. The storage system typically includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a user or host computer.

The storage operating system may use a temporary memory to store data before transferring data to a storage device. Typically, the temporary memory is a high speed, volatile memory. If there is power failure data at the temporary memory may be lost. Continuous efforts are being made for preserving data upon a power failure.

SUMMARY

In one embodiment, a method and system are provided for handling data when a power failure from a primary power source of a storage system is detected. The system provides a first memory and a second memory. The first memory is primarily used to store data when the primary power source is operating. If a power failure is detected, a first indicator is set to indicate that data is stored or being transferred to the second memory. Thereafter, data is transferred from the first memory to the second memory. Any errors during the transfer are logged. Once power is restored, data is transferred back to the first memory. A second indicator is set to indicate that there is no data at the second memory.

In another embodiment, a machine implemented method for a storage system having access to a storage device is provided. The method includes detecting power failure from a primary power source of the storage system; indicating a data transfer operation where data stored at a first memory is transferred to a second memory; transferring data from the first memory to the second memory using a second power source; storing any errors that occur while transferring data from the first memory to the second memory; disabling the secondary power source upon transferring data from the first memory to the second memory; transferring data from the second memory to the first memory, after power from the primary power source is restored; and setting an indicator to indicate that no data is stored at the second memory.

In yet another embodiment, a machine implemented method for a storage system having access to a storage device is provided. The method includes providing a first memory to the storage system for temporarily storing data when the storage system is powered by a first power source; providing a second memory for transferring data from the first memory to the second memory upon detecting a power failure. The power from a second power source is used for transferring the data from the first memory to the second memory.

The method further includes configuring a first indicator for indicating that data is being transferred from the first memory to the second memory after the power failure is detected; and configuring a second indicator for indicating that the second memory has no data, after data is transferred from the second memory to the first memory, upon restoring power from the first power source.

In another embodiment, a storage system having a first power source for powering the storage system; and a memory card interfacing with the storage system having a first memory for temporarily storing data when the storage system is powered by the first power source and a second memory for transferring data from the first memory to the second memory upon detecting a power failure is provided. A second power source is used for transferring the data from the first memory to the second memory.

A controller for the memory card sets a first indicator for indicating that data is being transferred from the first memory to the second memory after the power failure is detected and sets a second indicator for indicating that the second memory has no data, after data in transferred from the second memory to the first memory, upon restoring power from the first power source.

In yet another embodiment, a machine implemented method for a storage system having access to a storage device is provided. The method includes maintaining a data structure identifying a plurality of defective memory blocks of a non-volatile memory used as a secondary memory by a storage system to transfer data from a primary memory, if a power failure is detected; determining if a number of defective memory blocks does not conform with a programmable threshold value; and notifying the storage system of a potential failure of a segment of the secondary memory having the plurality of defective memory blocks.

This brief summary has been provided so that the nature of this disclosure may be understood quickly. A more complete understanding of the disclosure can be obtained by reference to the following detailed description of the various embodiments thereof in connection with the attached drawings.

BRIEF DESCRIPTION OF THE DRAWINGS

The foregoing features and other features will now be described with reference to the drawings of the various embodiments. In the drawings, the same components have the same reference numerals. The illustrated embodiments are intended to illustrate, but not to limit the present disclosure. The drawings include the following Figures.

DETAILED DESCRIPTION

As a preliminary note, the terms "component", "module", "system," and the like as used in this disclosure are intended to refer to a computer-related entity, either programmable instructions-executing general purpose processor, hardware, firmware and a combination thereof. For example, a component may be, but is not limited to being, a process running on a processor, a processor, an object, an executable, a thread of execution, a program, and/or a computer.

By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Computer executable components can be stored, for example, on computer readable media including, but not limited to, an ASIC (application specific integrated circuit), CD (compact disc), DVD (digital video disk), ROM (read only memory), floppy disk, hard disk, EEPROM (electrically erasable programmable read only memory), memory stick, flash memory device or any other non-volatile memory device, or any other storage device, in accordance with the claimed subject matter.

In one embodiment, a method and system are provided for handling data when a power failure from a primary power source of a storage system is detected. The system provides a first memory and a second memory. The first memory is primarily used to store data when the primary power source is operating. If a power failure is detected, a first indicator is set to indicate that data is stored or being transferred to the second memory. Thereafter, data is transferred from the first memory to the second memory. Any errors during the transfer are also logged. Once power is restored, data is transferred back to the first memory. A second indicator is then set to indicate that there is no data at the second memory.

Figure 1A:
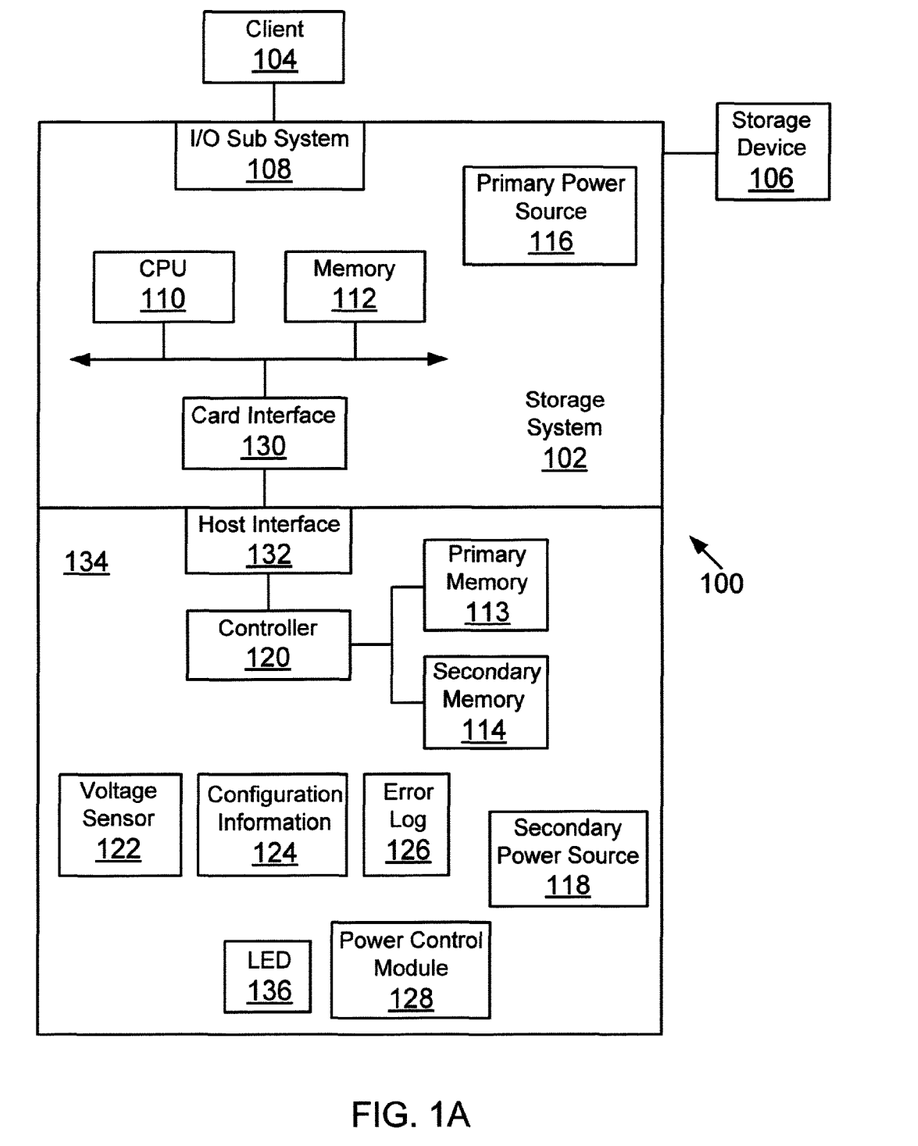
FIG. 1A shows a block diagram of a system using the embodiments disclosed herein.

System:

FIG. 1A shows a system 100 for storing data in a secondary memory when power failure of a primary power source is detected, in accordance with one embodiment. System 100 includes a storage system 102 communicating with at least one client computing system 104 (may also be referred to as "client 104") and at least one storage device 106. The storage system 102 may be operationally coupled to client 104 through a network (not shown). The network may be, for example, a local area network (LAN), a wide area network (WAN), a storage area network (SAN), or any other type of network or a combination of networks.

Client 104 may be, for example, a conventional personal computer (PC), workstation, or the like. The storage device 106 may include tape drives, conventional magnetic disks, optical disks such as CD-ROM or DVD based storage, magneto-optical (MO) storage, flash memory storage device or any other type of non-volatile storage devices suitable for storing data.

Client 104 typically issues read and write requests for reading and writing data to storage device 106. The storage system 102 is configured to handle and process such requests.

Storage system 102 includes an I/O subsystem 108 for communicating the read and write requests to and from client 104 and storage device 106. In one embodiment, the I/O subsystem 108 is coupled to a central processing unit (CPU) 110 that is configured to control the overall processing of the read and write requests by executing program instructions, for example, a storage operating system executed out of a memory 112 that is accessible to CPU 110. Memory 112 represents any form of random access memory (RAM), read-only memory (ROM), flash memory, or the like, or a combination of such devices.

Storage system 102 includes a primary power source 116. During normal operation, CPU 110 and other components of storage system 102 are powered by the primary power source 116.

In one embodiment, storage system 102 further includes a primary memory 113 and a secondary memory 114 coupled to a controller 120 which, in turn, is coupled to CPU 110 via a host interface 132. The host interface 132 may be a PCI-Express interface or any other interface type.

The primary memory 113 may be used by CPU 110 to temporarily store data before data is sent to storage device 106 in response to a write request. The primary memory 113 may also temporarily store data that is read from storage device 106 in response to a read request.

In one embodiment, the secondary memory 114 may be a non-volatile memory that is used as a "back-up" for primary memory 113. The primary memory 113 may be a double data rate (DDR) volatile memory that is accessible at a higher rate than secondary memory 114. The primary memory 113 is used by CPU 110 to store data at a faster rate and the non-volatile, secondary memory 114 is used as backup storage, if the primary power source 116 fails or if a power failure is detected.

A secondary power source 118 is also provided as a back-up, if a power failure is detected. When a power failure is detected, then secondary power source 118 provides back-up power to primary memory 113 such that content stored at primary memory 113 is not destroyed. The secondary power source is also used for managing data transfer from the primary memory 113 to the secondary memory 114, after a power failure is detected. This process is referred to as "de-staging" and is described below in detail.

In one embodiment, the primary memory 113, the secondary memory 114, the secondary power source 118, and the controller 120 are separate from the storage system 102. The primary memory 113, the secondary memory 114, the secondary power source 118, and the controller 120 may reside on a card 134 (may also be referred to as non-volatile, random access memory (NVRAM) card 134) which, in turn, is coupled to the storage system 102 in the manner shown. In various embodiments, such coupling may be accomplished via the host interface 132 and card interface 130.

In response to a write request, data associated with a write request is first stored in memory 112 of storage system 102. Thereafter, a copy of the data may be transferred to the primary memory 113, via a direct memory access (DMA) operation. Thereafter, such write request data may be processed by the CPU 110, for initiating data writes to the storage device 106.

If a power failure is detected, the controller 120 is adapted to carry out the de-staging process during which the write request data from the primary memory 113 is transferred to the secondary memory 114, where it will not be lost even if there is a the power failure. The secondary power source 118 is used to power the de-staging process, described below in more detail.

In one embodiment, card 134 includes a power control module 128 that controls secondary power source 118 based on certain configuration parameters that are included in configuration data 124. In one embodiment, configuration data may be stored at a read-only memory, for example, an Electrically Erasable Programmable Read-Only Memory (EEPROM) (not shown) or any other memory type.

In one embodiment, card 134 also includes a voltage sensor 122 that monitors a system voltage derived from the primary power source 116. The voltage sensor 122 is used to detect a power failure. In one embodiment, if the voltage sensor does not detect a minimum threshold voltage, then controller 120 assumes that there is a power failure. The minimum threshold voltage may be configured and stored as part of configuration data 124.

If a power failure is detected and data is copied from the primary memory 113 to secondary memory 114, there may be errors. Card 134 maintains those errors as a data structure, for example, as an error log 126. The error log 126 is made available to CPU 110 after power from the primary power source 116 is restored, as described below in more detail.

Card 134 includes a light emitting diode (LED) device 136. The LED device 136 is used to indicate if there is any data in secondary memory 114. For example, a red LED light (may also be referred to as a first indicator) may be used to indicate that data is stored at secondary memory 114 or is being written to secondary memory 114. A green LED light (may also be referred to as a second indicator) indicates that there is no data at secondary memory 114. The LED lights are set by using configuration data 124, as described below in more detail.

Figure 1B:
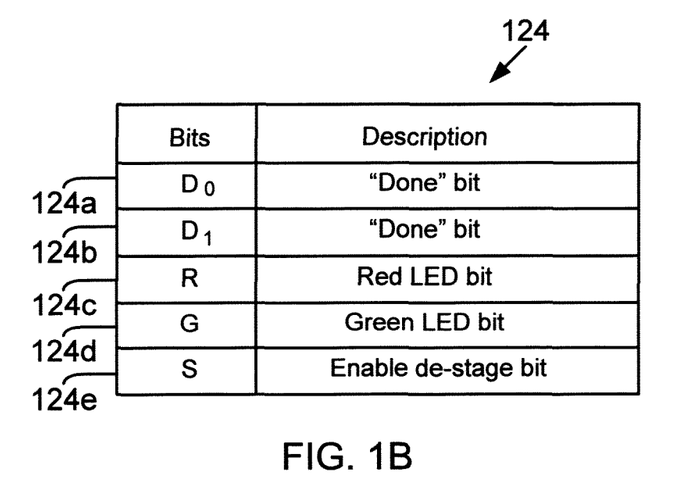
FIG. 1B shows an example of configuration data stored and used by the system of FIG. 1A, according to one embodiment.

In one embodiment, configuration data 124 may include a plurality of bit settings that are used by card 134 during the de-staging and re-staging operations. A re-staging operation occurs after a de-staging operation when power from the primary power source 116 is restored. The various bits of configuration data 124 are shown in FIG. 1B. The bits may be located at one or more EEPROMs, a register location or any other storage location (including volatile memory 113) that is accessible to controller 120.

Referring now to FIG. 1B, in one embodiment, configuration data 124 includes bits D0 124a and D1 124b. These bits may be referred to as "done" bits. Bits 124a and 124b, when set to a particular value, for example, 1, indicates to power control module 128 that a de-staging process has been completed and it should shut off secondary power source 118, as described below in more detail.

The red bit ("R") 124c is used to set the LED 136 to red, as described below in more detail. The green bit ("G") 124d is used to set the LED 136 to green, as described below in more detail.

The "S" bit 124e is used to enable or disable the de-staging process 140, which is also described below in detail with respect to FIG. 1C. In one embodiment, the S bit 124e may be stored at a volatile memory, for example, primary memory 113.

Figure 1C:
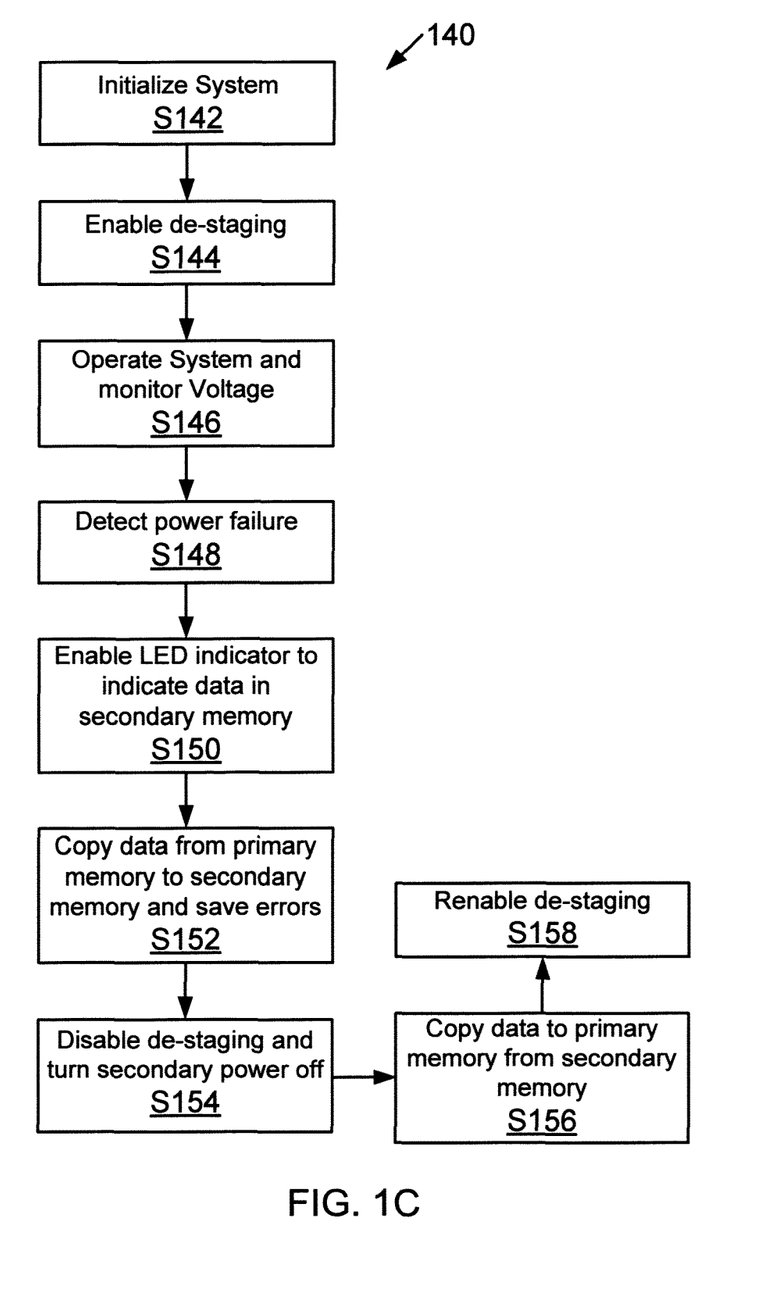
FIG. 1C shows a process flow diagram, according to one embodiment.

As shown in FIG. 1C, process 140 begins with block S142 when storage system 102 and card 134 are initialized. In block S144, bits D0 124a and D1 124b are disabled and the S bit 124e is set, in one embodiment. This enables the de-staging process using secondary power source 118, if a power failure is detected.

In block S146, system 100 operates normally and data is stored at primary memory 113 before it is stored in storage device 106. Data may also be stored at primary memory 113 after it is read from storage device 106 and before it is presented to storage system 102. In one embodiment, as described above, primary memory 113 is a DDR memory that operates at a high speed such that data is moved efficiently to and from primary memory 113.

During block S146, in one embodiment, voltage sensor 122 monitors the voltage (not shown) from the primary power source 116. If the voltage drops below a certain threshold value, then a power failure is detected in block S148. This means that the primary power source 116 is no longer providing enough power for storage system 102 to operate normally.

In block S150, in one embodiment, the red bit 124c is enabled by controller 120. The LED 136 then displays a red light to indicate that there may be data in secondary memory 114. The red light may serve as an indicator for a user not to discard card 134 for any reason because it may have data in the secondary memory 114.

In block S152, data (or information) residing at the primary memory 113 before the power failure, is copied to the secondary memory 114. If there are any errors during the transfer, then the errors may be stored as part of a data structure, for example, the error log 126. In one embodiment, the error log 126 may be stored at a NOR flash (not shown) or any other memory location that is accessible to CPU 110 after power is restored. The error log 126 is stored at a non-volatile memory so that it can be retained and is available, if there is another power failure. The error log 126 may also be obtained by any other computing system to diagnose the errors.

In block S154, after the data is copied and the errors are logged, the S bit 124e is cleared to disable the de-staging process, in one embodiment. One of the done bits, D0 124a and D1 124b is also set. This indicates to the power control module 128 to turn off the secondary power source 118. In one embodiment, the secondary power source 118 is a battery and by turning off the battery, secondary power is conserved for future de-staging operations.

Thereafter, in block S156, after the primary power source 116 is restored, data from the secondary memory 114 is transferred back to the primary memory 113 so that it can be made available to CPU 110. This is also referred to as the re-staging process. During this process, the error log 126 is also provided to CPU 110. Any errors that can be corrected during the re-staging process are corrected. For example, when data is transferred from primary memory 113 to secondary memory 114, there may bit errors. These bit errors are recorded in the error log 126. CPU 110 is aware of what was in the primary memory 113 prior to the detected power failure. CPU 110 may use the error log to correct the bit errors.

Thereafter, in block S158, de-staging is again enabled by disabling the done bits D0 124a and 124b and setting the S bit 124e, in one embodiment. The green bit 124d is also set so that the LED 136 provides a green light indicating that the secondary memory 114 does not have any data transferred from the primary memory 113.

Figure 2A:
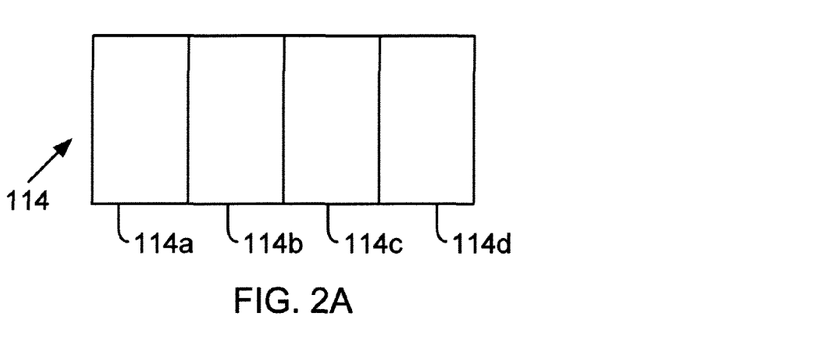
FIG. 2A shows an example of a secondary memory used in the system of FIG. 1A.

Bad Block Management:

FIG. 2A shows a block diagram of secondary memory 114. As an example, in this embodiment, secondary memory 114 may include four segments, 114a-114d. Each segment may be independent memories or one memory may be partitioned into four segments. The embodiments disclosed herein are not limited to any particular number of memories or segments.

Figure 2B:
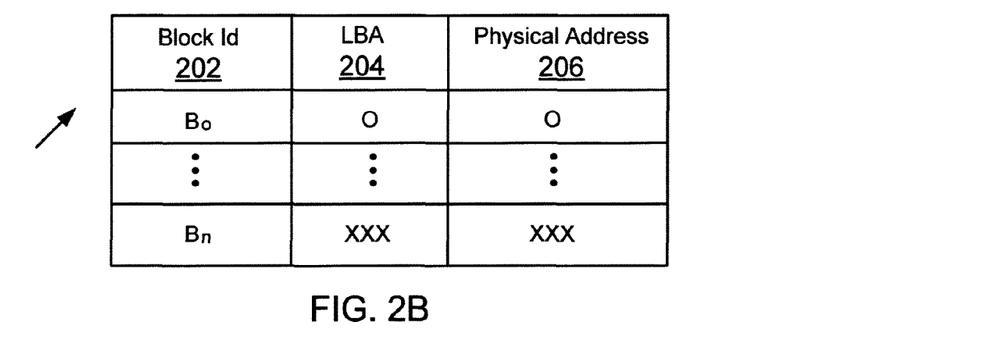
FIG. 2B shows an example of a memory mapping data structure, used according to one embodiment.

Each segment includes a plurality of blocks, where each block has a logical block address (LBA). The LBAs for the plurality of blocks are used to store and retrieve data from the physical non-volatile memory of secondary memory 114. Controller 120 maintains a LBA to physical address mapping data structure 200, as shown in FIG. 2B. Mapping data structure 200 identifies the blocks in column 202, the LBA for the block are provided in column 204 and the physical address associated with the LBA is provided in column 206.

To store data, typically, controller 120 receives a LBA and then uses the LBA to store data at a physical location. Controller 120 updates data structure 200 so that data can later be retrieved from a physical location using data structure 200.

Figure 3A:
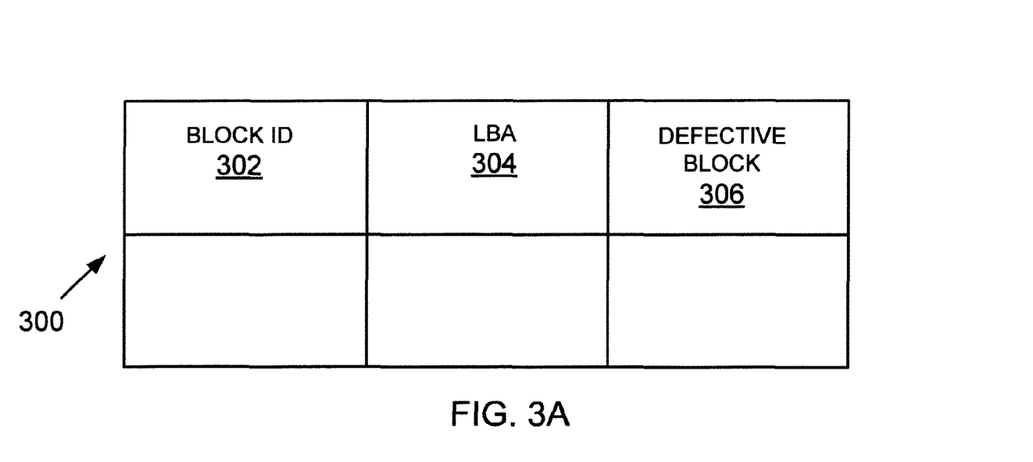
FIG. 3A shows an example of a data structure used for managing defective memory blocks, according to one embodiment.

Memory blocks of secondary memory 114 may become defective over time due to write and erase cycles or for any other reason. In one embodiment, controller 120 uses a defective block map 300 to track defective memory blocks within secondary memory 114 as shown in FIG. 3A. In one embodiment, defective block map is stored at a memory location that is accessible to controller 120. The memory location may be at secondary memory 114 or any other memory.

The defective block map 300 is a data structure that includes column 302 to identify one or more defective blocks, column 304 provides the LBA of the defective blocks and column 306 includes an indicator identifying the defective block(s).

In one embodiment, controller 120 uses defective block map 300 to predict failure of a segment of secondary memory 114. A threshold value is stored as part of configuration data 124 to predict the failure. The threshold value indicates to controller 120 the likelihood of a memory segment failing. For example, if defective memory map 300 shows that more than 48% blocks of segment 114a are defective at any given time, and if the threshold value of a non-defective segment is set to 40%, then controller 120 concludes that the memory segment 114a is going to fail because the percentage of defective blocks does not conform to the threshold value.

Controller 120 notifies CPU 110 of the prediction. CPU 110 may indicate the same to a user who may then replace segment 114a or take the appropriate proactive measure. Because the prediction initiates a proactive measure of replacing a memory segment, this ensures that only usable and substantially non-defective non-volatile memory is being used for the de-staging/re-staging process.

Figure 3B:
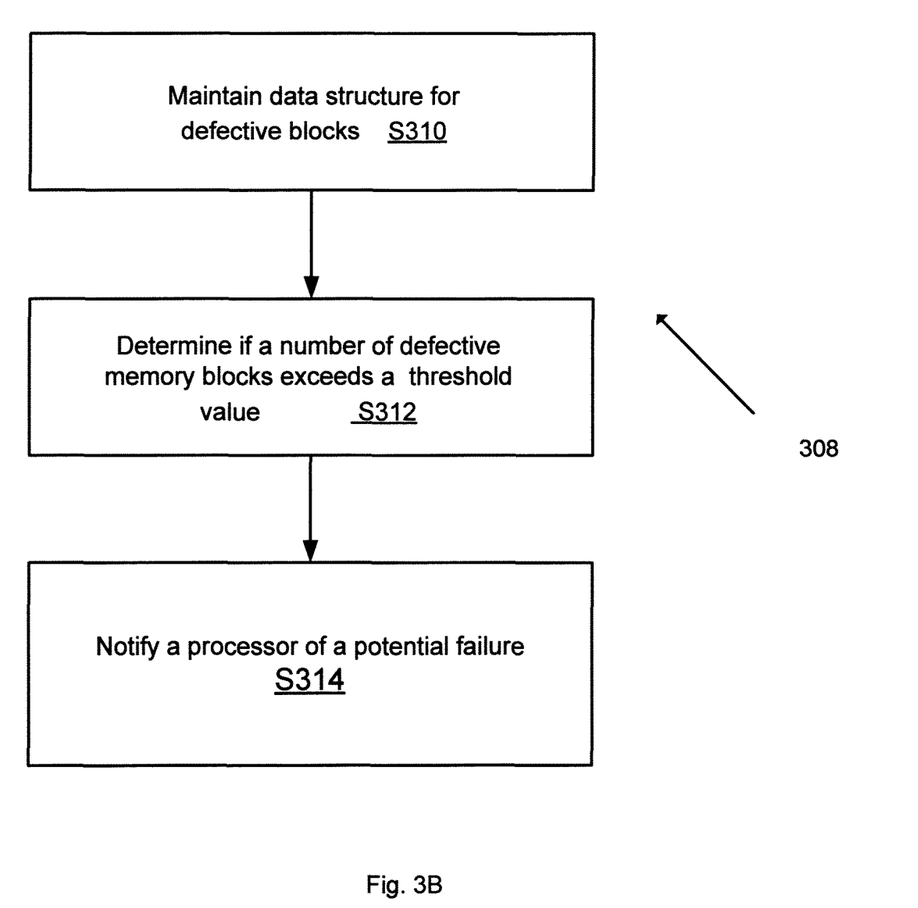
FIG. 3B shows a process flow for managing defective memory blocks, according to one embodiment.

FIG. 3B shows a process 308 for using the defective block map 300, according to one embodiment. The process begins in block S310, where controller 120 maintains a data structure, for example, defective block map 300, for identifying a plurality of defective memory blocks of secondary memory 114. In block, S312, controller 120 determines if a number of defective memory blocks exceeds a programmable threshold value. If the number exceeds the threshold value, then controller 120 notifies CPU 110 of a potential failure of a segment of the secondary memory 114.

Figure 4:
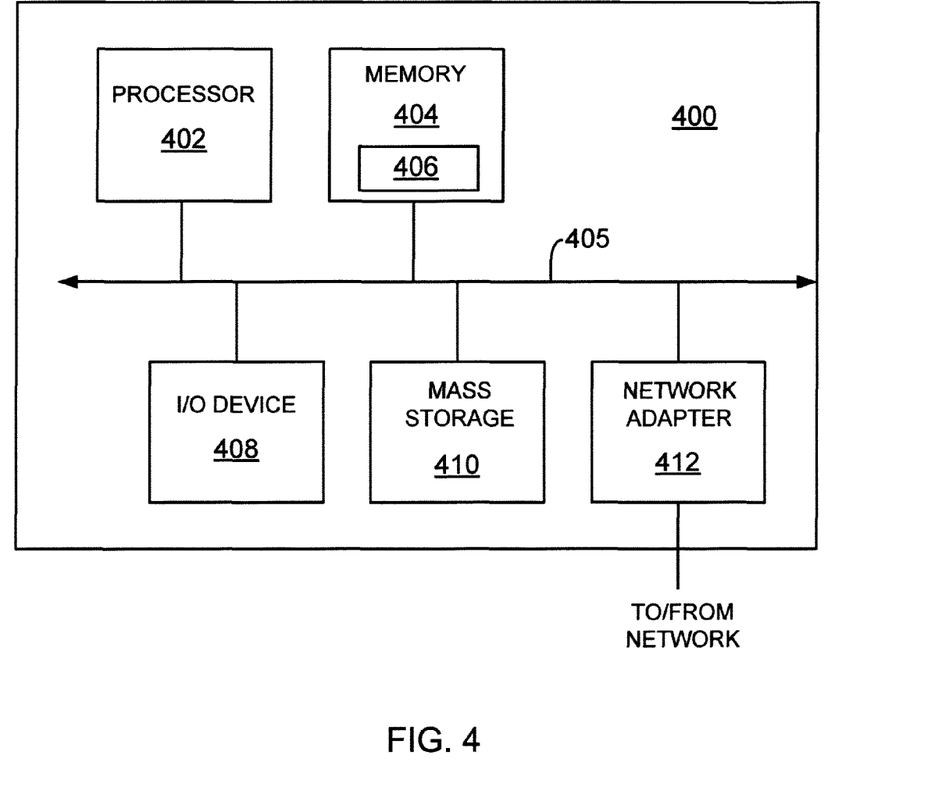
FIG. 4 is an example of a computing system, used according to one embodiment.

Processing System:

FIG. 4 is a high-level block diagram showing an example of the architecture of a processing system, at a high level, in which the executable instructions as described above can be implemented. The processing system 400 can be client 104, storage system 102, a console and others. Note that certain standard and well-known components which are not germane to the present invention are not shown in FIG. 4.

The processing system 400 includes one or more processors 402 and memory 404, coupled to a bus system 405. The bus system 405 shown in FIG. 4 is an abstraction that represents any one or more separate physical buses and/or point-to-point connections, connected by appropriate bridges, adapters and/or controllers. The bus system 405, therefore, may include, for example, a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (sometimes referred to as "Firewire").

The processors 402 are the central processing units (CPUs) of the processing system 400 and, thus, control its overall operation. In certain embodiments, the processors 402 accomplish this by executing programmable instructions stored in memory 404. A processor 402 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

Memory 404 represents any form of random access memory (RAM), read-only memory (ROM), flash memory, or the like, or a combination of such devices. Memory 404 includes the main memory of the processing system 400. Instructions 406 which implements the process steps of FIG. 1C may reside in and may be executed (by processors 402) from memory 404.

Also connected to the processors 402 through the bus system 405 are one or more internal mass storage devices 410, and a network adapter 412. Internal mass storage devices 410 may be or may include any conventional medium for storing large volumes of data in a non-volatile manner, such as one or more magnetic or optical based disks. The network adapter 412 provides the processing system 400 with the ability to communicate with remote devices (e.g., storage servers 102) over a network and may be, for example, an Ethernet adapter, a Fibre Channel adapter, or the like. The processing system 400 also includes one or more input/output (I/O) devices 408 coupled to the bus system 405. The I/O devices 408 may include, for example, a display device, a keyboard, a mouse, etc.

Thus, a method and apparatus for providing redundant storage is provided. Note that references throughout this specification to "one embodiment" or "an embodiment" mean that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics being referred to may be combined as suitable in one or more embodiments of the invention, as will be recognized by those of ordinary skill in the art.

While the present disclosure is described above with respect to what is currently considered its preferred embodiments, it is to be understood that the disclosure is not limited to that described above. To the contrary, the disclosure is intended to cover various modifications and equivalent arrangements within the spirit and scope of the appended claims.

What is claimed is:

1. A machine implemented method for a storage system having access to a storage device, comprising:
configuring a first visual indicator for indicating that data is being transferred from a first memory to a second memory after a power failure of a primary power source of the storage system is detected;
configuring a second visual indicator for indicating that the second memory has no data, after data is transferred from the second memory to the first memory, upon restoring power from the primary power source;
detecting power failure from the primary power source of the storage system;
using the first visual indicator for indicating a data transfer operation where data stored at the first memory is transferred to the second memory;
transferring data from the first memory to the second memory using a secondary power source;

storing any bit errors that occur while transferring data from the first memory to the second memory in a data structure;

disabling the secondary power source upon transferring data from the first memory to the second memory;

transferring data from the second memory to the first memory, after power from the primary power source is restored;

using the second visual indicator to indicate that no data is stored at the second memory; and providing the data structure to a processor after the primary power source is restored to correct any bit error that occurred during transfer from the first memory to the second memory.

2. The method of claim 1, wherein the first memory is a double data rate volatile memory and the second memory is a non-volatile memory.

3. The method of claim 1, wherein the first visual indicator to visually indicate that data is being transferred from the first memory to the second memory is based on a set bit value of a configuration data structure.

4. The method of claim 1, wherein the second visual indicator for visually indicating that there is no data stored at the second memory, after data is transferred from the second memory to the first memory upon power restore is based on a set bit value of a configuration data structure.

5. The method of claim 1, wherein the first memory, the second memory, and the second power source are included on a card that interfaces with the storage system.

6. The method of claim 5, wherein a controller for the card controls transfer of data from the first memory to the second memory.

7. A machine implemented method for a storage system having access to a storage device, comprising:

providing a first memory to the storage system for temporarily storing data when the storage system is powered by a first power source;

providing a second memory for transferring data from the first memory to the second memory upon detecting a power failure; wherein power from a second power source is used for transferring the data from the first memory to the second memory;

configuring a first visual indicator at a light emitting diode (LED) device for indicating that data is being transferred from the first memory to the second memory after the power failure is detected;

configuring a second visual indicator at the LED device for indicating that the second memory has no data, after data is transferred from the second memory to the first memory, upon restoring power from the first power source; and using a data structure for storing any bit error that occurs when data is transferred from the first memory to the second memory, the data structure being used to correct the bit error after power from the first power source is restored.

8. The method of claim 7, wherein the first memory is a double data rate volatile memory and the second memory is a non-volatile memory.

9. The method of claim 7, wherein the first visual indicator is configured by setting a bit to a certain value, which is used to provide a visual indication showing that data is being transferred to the second memory.

10. The method of claim 7, wherein the second indicator is configured by setting a bit to a certain value, which is used to provide a visual indication showing that there is no data stored at the second memory.

11. The method of claim 7, wherein the second power source is automatically switched off after data is transferred from the first memory to the second memory.

12. The method of claim 7, wherein the first memory, the second memory and the second power source are included on a card that interfaces with the storage system.

13. The method of claim 12, wherein a controller for the card controls transfer of data from the first memory to the second memory.

14. A non-transitory, machine readable storage medium storing executable instructions, which when executed by a machine, causes the machine to perform a method, the method comprising:

configuring a first visual indicator for indicating that data is being transferred from a first memory to a second memory after a power failure of a primary power source of the storage system is detected;

configuring a second visual indicator for indicating that the second memory has no data, after data is transferred from the second memory to the first memory, upon restoring power from the primary power source;

detecting power failure from the primary power source of the storage system;

using the first visual indicator for indicating a data transfer operation where data stored at the first memory is transferred to the second memory;

transferring data from the first memory to the second memory using a secondary power source;

storing any bit errors that occur while transferring data from the first memory to the second memory in a data structure;

disabling the secondary power source upon transferring data from the first memory to the second memory;

transferring data from the second memory to the first memory, after power from the primary power source is restored;

using the second visual indicator to indicate that no data is stored at the second memory; and providing the data structure to a processor after the primary power source is restored to correct any bit error that occurred during transfer from the first memory to the second memory.

15. The storage medium of claim 14, wherein the first memory is a double data rate volatile memory and the second memory is a non-volatile memory.

16. The storage medium of claim 14, wherein the first visual indicator to visually indicate that data is being transferred from the first memory to the second memory is based on a set bit value of a configuration data structure.

17. The storage medium of claim 14, wherein the second visual indicator for visually indicating that there is no data stored at the second memory, after data is transferred from the second memory to the first memory upon power restore is based on a set bit value of a configuration data structure.

18. The storage medium of claim 14, wherein the first memory, the second memory, and the second power source are included on a card that interfaces with the storage system.

19. A system comprising:

a memory containing machine readable medium comprising machine executable code having stored thereon instructions; and a processor module coupled to the memory, the processor module configured to execute the machine executable code to:

configure a first visual indicator for indicating that data is being transferred from a first memory to a second memory after a power failure of a primary power source of the storage system is detected;

configure a second visual indicator for indicating that the second memory has no data, after data is transferred from the second memory to the first memory, upon restoring power from the primary power source;

detect power failure from the primary power source of the storage system;

use the first visual indicator for indicating a data transfer operation where data stored at the first memory is transferred to the second memory;

transfer data from the first memory to the second memory using a secondary power source;

store any bit errors that occur while transferring data from the first memory to the second memory in a data structure;

disable the secondary power source upon transferring data from the first memory to the second memory;

transfer data from the second memory to the first memory, after power from the primary power source is restored;

use the second visual indicator to indicate that no data is stored at the second memory; and use the data structure after the primary power source is restored to correct any bit error that occurred during transfer from the first memory to the second memory.

20. The system of claim 19, wherein the first memory is a double data rate volatile memory and the second memory is a non-volatile memory.

21. The system of claim 19, wherein the first visual indicator to visually indicate that data is being transferred from the first memory to the second memory is based on a set bit value of a configuration data structure.

22. The system of claim 19, wherein the second visual indicator for visually indicating that there is no data stored at the second memory, after data is transferred from the second memory to the first memory upon power restore is based on a set bit value of a configuration data structure.

23. The system of claim 19, wherein the first memory, the second memory, and the second power source are included on a card that interfaces with the storage system.

24. The system of claim 23, wherein a controller for the card controls transfer of data from the first memory to the second memory.

* * * * *